(12) United States Patent
Stetter et al.

(10) Patent No.: US 6,365,512 B1
(45) Date of Patent: Apr. 2, 2002

(54) METHOD AND APPARATUS FOR A DIRECT BURIED STRAP FOR SAME LEVEL CONTACT INTERCONNECTIONS FOR SEMICONDUCTOR DEVICES

(75) Inventors: Michael Stetter; Frank Grellner, both of Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/598,790

(22) Filed: Jun. 21, 2000

(51) Int. Cl.$^7$ ............................................... H01L 21/76
(52) U.S. Cl. ........................ 438/661; 438/670; 438/682
(58) Field of Search ................................ 438/661, 663, 438/664, 651, 655, 670, 682, 683

(56) References Cited

U.S. PATENT DOCUMENTS

| | | |
|---|---|---|
| 5,670,805 A | 9/1997 | Hammerl et al. |
| 5,798,297 A | 8/1998 | Winnerl et al. |
| 5,981,372 A | * 11/1999 | Goto et al. |

OTHER PUBLICATIONS

Noda et al., "A 2.9 $\mu m^2$ Embedded SRAM Cell with Co–Salicide Direct–Strap Technology for 0.18 $\mu m$ High Performance CMOS Logic," IEDM Technical Digest (Cat. No. 97CH36103) IEEE: New York, NY, USA, 1997 p. 847–850, 944 pp., 7 refs., Conference; Washington, DC, USA, Dec. 7–10, 1997.

\* cited by examiner

*Primary Examiner*—Caridad Everhart

(57) ABSTRACT

A method and apparatus for forming a direct buried strap for a semiconductor device, in accordance with the present invention, includes forming a gate stack on a semiconductor substrate, and forming a protective layer on sidewalls of the gate stack. The protective layer extends horizontally over a portion of the semiconductor substrate adjacent to the gate stack. A conductive layer is formed over the protective layer and in contact with a gate conductor of the gate stack and in contact with a diffusion region formed in the semiconductor substrate adjacent to the gate conductor. A dielectric layer is formed over the conductive layer, and the dielectric layer is patterned to expose a portion of the conductive layer. The portion of the conductive layer which is exposed includes a portion of the conductive layer over the gate conductor and a portion of the substrate adjacent to the gate conductor. The exposed areas of the conductive layer are silicided to form a direct buried strap and a silicided diffusion region in the substrate. The direct buried strap electrically connects the gate conductor to the diffusion region in a same level of the semiconductor device.

20 Claims, 3 Drawing Sheets ive dielectric layer on vertical surfaces, the protective dielectric layer including a horizontal portion extending outward from the gate stack in contact with the substrate, forming a conductive layer capable of being silicided in contact with a gate conductor of the gate stack and the substrate adjacent to the gate stack beyond the horizontal portion of the protective dielectric layer, forming a sacrificial dielectric layer over the conductive layer, patterning the sacrificial dielectric layer to expose a portion of the conductive layer, the portion of the conductive layer which is exposed includes a portion of the conductive layer over the gate stack in contact with the gate conductor and a portion of the substrate adjacent to the gate stack beyond the horizontal portion of the protective dielectric layer, and siliciding the exposed areas of the conductive layer to form a direct buried strap along the gate stack over the protective dielectric layer and a silicided diffusion region on the substrate adjacent to the gate stack beyond the horizontal portion of the protective dielectric layer, the direct buried strap electrically connecting the gate conductor to the silicided diffusion region in a same level of the semiconductor device.

METHOD AND APPARATUS FOR A DIRECT BURIED STRAP FOR SAME LEVEL CONTACT INTERCONNECTIONS FOR SEMICONDUCTOR DEVICES

BACKGROUND

1. Technical Field

This disclosure relates to semiconductor fabrication and more particularly, to a method and apparatus for making interconnections in a same metal level.

2. Description of the Related Art

An ever-present need in the semiconductor industry is to provide more densely populated chips while maintaining or increasing yield. Semiconductor devices having memory cells, for example, static random access (SRAM) cells, are always subject to efforts for reducing the cell size as much as possible without decreasing the yield. One element, which consumes real estate in a memory cell, is the cross-coupling between inverters. Cross-coupling of an inverter includes connecting a source or drain region of a transistor to a gate of the transistor. In a physical layout of the transistor, e.g., on a semiconductor chip, this means that a source/drain diffusion region is connected to a gate conductor.

Since, the gate has to be electrically connected to the diffusion, an electrical link is provided which includes a first contact to the diffusion, a metal line in an upper metal layer connected to the first contact and to a second contact, and the second contact connects to the gate conductor. This connection scheme requires, contacts to reach upper metal layers (e.g., M1). Further, the contacts and diffusion regions are lithographically formed and include dimensions limited by lithography and processing which tend to increase their size and result in area costs.

Therefore, a need exists for a direct strap and a method for forming the same which provide an interconnection on a same level. A further need exists for the buried strap to enable a reduction in cell size and permit the area above the cell to be available for routing of upper metal lines.

SUMMARY OF THE INVENTION

A method and apparatus for forming a direct buried strap for a semiconductor device, in accordance with the present invention, includes forming a gate stack on a semiconductor substrate, and forming a protective layer on sidewalls of the gate stack. The protective layer extends horizontally over a portion of the semiconductor substrate adjacent to the gate stack. A conductive layer is formed over the protective layer and in contact with a gate conductor of the gate stack and in contact with a diffusion region formed in the semiconductor substrate adjacent to the gate conductor. A dielectric layer is formed over the conductive layer, and the dielectric layer is patterned to expose a portion of the conductive layer. The portion of the conductive layer which is exposed includes a portion of the conductive layer over the gate conductor and a portion of the substrate adjacent to the gate conductor. The exposed areas of the conductive layer are silicided to form a direct buried strap and a silicided diffusion region in the substrate. The direct buried strap electrically connects the gate conductor to the diffusion region in a same level of the semiconductor device.

Another method for forming a direct buried strap for a semiconductor device, in accordance with the invention, includes the steps of providing a silicon substrate, forming a gate stack on the substrate, the gate stack including a In other methods, the step of siliciding may include the step of depositing silicon on the conductive layer. The step of depositing silicon on the conductive layer may include cold deposition of silicon in a temperature range of between about 20° C. and about 400° C., with a step of performing a rapid thermal anneal (RTA) or a hot deposition of silicon in a temperature range of between about 400° C. and about 700° C. The step of patterning the dielectric layer to expose a portion of the conductive layer may include the step of protecting a second portion of the conductive layer from siliciding by employing the dielectric layer as a mask. The method may include stripping the dielectric layer after siliciding, and stripping the second portion of the conductive layer. The step of annealing the semiconductor device by employing a rapid thermal anneal may also be included. The substrate may include silicon and the second portion of the conduction layer may include a third portion which contacts a portion of the substrate and the step of annealing the third portion of the conductive layer and the portion of the substrate in contact with the third portion to form a silicided junction may be included. The method may include the steps of forming a second dielectric layer over the direct buried strap and the silicided diffusion region, and forming metal layers over the second dielectric layer wherein the gate conductor is connected to the silicided diffusion region while avoiding interconnection to other metal layers. The conductive layer may include one of Tungsten, Cobalt and Titanium.

In still other methods, the step of patterning the sacrificial dielectric layer to expose a portion of the conductive layer may include the step of protecting a second portion of the conductive layer from siliciding by employing the dielectric layer as a mask and may further include the steps of stripping the sacrificial dielectric layer after siliciding and stripping the second portion of the conductive layer. The second portion of the conduction layer may include a third portion which contacts a portion of the substrate and further includes the step of annealing the third portion of the conductive layer and the portion of the substrate in contact with the third portion to form a silicided junction. The method may further include the steps of forming an interlevel dielectric layer over the gate stack and the silicided diffusion region and forming metal layers over the interlevel dielectric layer wherein the gate conductor is connected to the silicided diffusion region while avoiding interconnection to other metal layers.

A semiconductor device, in accordance with the present invention, having a transistor cross-coupled in a same level includes a substrate having a gate stack formed thereon, the gate stack including a gate conductor. A protective dielectric layer is formed on vertical surfaces on the gate stack. The protective dielectric layer includes a horizontal portion extending outward from the gate stack in contact with the substrate. A first diffusion region is formed on a first side of the gate stack beyond the horizontal portion of the protective dielectric layer. A direct strap is formed over the protective dielectric layer. The direct strap connects the first diffusion region to the gate conductor in a same level of the semiconductor device.

In other embodiments, the direct strap preferably includes one of Tungsten silicide, Cobalt silicide and Titanium silicide. The device may include a second diffusion region formed on a second side of the gate stack. The second side is opposite the first side, and the first and second diffusion regions and the gate stack form a transistor. The device may include an interlevel dielectric layer formed over the transistor.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENT

The present invention relates to semiconductor fabrication, and more particularly to a method and apparatus including a buried strap which connects components in a same level. For example, in cross-coupled transistors, such as field effect transistors integrated on a semiconductor chip, the invention provides a connection between a gate and a diffusion region of the transistor without making a connection to upper metal layers. Further, the connection may be made without the formation of conventional contacts on the gate conductor or on a diffusion region for the source/drain of the transistor. Advantageously, the present invention provides an option which can be taken in or out of a processing sequence without any impact on the process itself.

Figure 1:
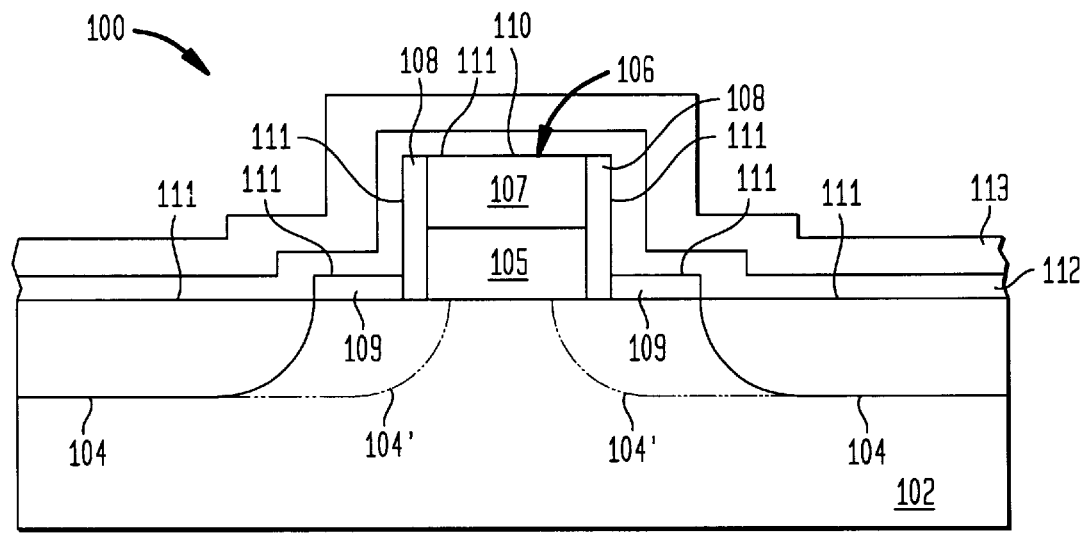
FIG. 1 is a cross-sectional view of a semiconductor device showing a conductive layer deposited over a gate stack in accordance with the present invention.

Referring now in specific detail to the drawings in which like reference numerals identify similar or identical elements throughout the several views, and initially to FIG. 1, a partial cross-section of a semiconductor device 100 is shown. Device 100 may include a semiconductor memory device, such as a static random access memory device, a dynamic random access memory device or other memory device. Device 100 may also include an embedded memory device, a logic device or other semiconductor devices. Device 100 includes a substrate 102, for example, a monocrystalline silicon substrate. Gate stack 106 is formed by patterning and etching conductive layers. The conductive layers may include, for example, doped polysilicon 107 and/or a metal silicide 105, such as, for example, tungsten silicide. Gate stack 106 preferably includes a protective dielectric layer 108. In a preferred embodiment, dielectric layer 108 may include a nitride, such as silicon nitride. Protective dielectric layer 108 is removed from at least a portion of a top surface 110 of gate stack 106 to provide access to conductive layers therein. Protective dielectric layer 108 preferably covers vertical walls of gate stack 106. Protective dielectric layer 108 extends horizontally outward from gate stack 106 in contact with substrate 102 in portions 109. Portions 109 may extend outward a distance of between about 5 nm and about 100 nm from gate stack 106. Protective dielectric layer 108 provides an improved transition for a direct buried strap between gates stack 106 and substrate 102. Sharp corners between the monocrystalline Si substrate 102 and the polysilicon 105 of the gate stack 106 are eliminated. These corner transitions are an important factor affecting reliability of the direct strap. Sharp corners or transitions can result in high yield losses. Advantageously, the present invention employs portions 109 to provide transitions to desensitize the substrate 102 to gate stack 106 transition region. This significantly improves reliability.

Diffusion regions 104 (or 104' shown in phantom lines to show an alternate placement of the diffusion region) are formed in substrate 102 by, for example, ion implantation. Diffusion regions 104 may be formed next to or even below a gate stack 106. Diffusion regions 104 (or 104') may include a source or drain region as is known in the art.

After cleaning a surface 111, a conductive layer 112, preferably a metal capable of forming a silicide, such as W, Co or Ti, is formed over gate stack 106 and diffusion regions 104 (or 104'). Conductive layer 112 advantageously contacts a gate conductor of gate stack 106 and substrate 102 in regions 104. Conductive layer 112 may include a thickness from between about 5 nm to about 50 nm. A sacrificial dielectric layer 113 is deposited to protect conductive layer 112 from oxidation. Materials, such as, for example, TiN, may also be employed for sacrificial layer 113 to protect conductive layer 112 from oxidation.

Conductive layer 112 and layer 113 are formed over gate stacks 106 before any resist patterning. Otherwise, problems may arise due to incomplete resist strip or overdone resist strip of the gate conductor. This would cause reliability problems resulting in a yield risk for the structure.

Figure 2:
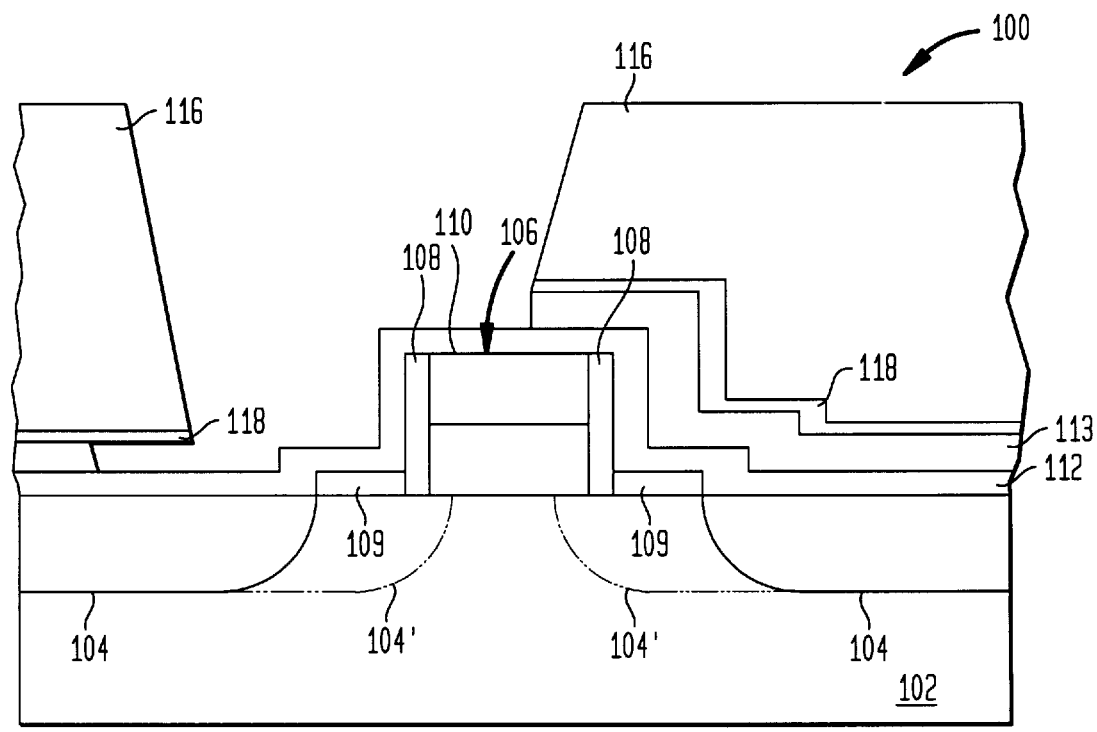
FIG. 2 is a cross-sectional view of the semiconductor device of FIG. I showing a sacrificial dielectric layer patterned over the gate stack in accordance with the present invention.

Referring to FIG. 2, a resist layer 116 is deposited over gate stack 106 and patterned to expose a portion of sacrificial dielectric layer 113. Resist layer 116 may include an anti-reflection layer (ARC) 118 to improve resist exposure and development. Resist layer 116 may include a photoresist material sensitive to ultraviolet light. Sacrificial dielectric layer 113 is removed selective to conductive layer 112 in areas exposed by the removal (development) of resist layer 116. Sacrificial dielectric layer 113 is preferably removed from a portion of top surface 110 and an area (over diffusion region 104) adjacent to gate stack 106. The removal of sacrificial dielectric layer 113 is preferably performed using an etch process which is selective to both resist layer 116 and conductive layer 112, for example an SC1 (e.g., an ammonium hydroxide/hydrogen peroxide solution) etch process. Dielectric layer 113 is used to form a mask as part of the salicide (e.g., self-aligned silicide) process for formation of a direct strap and silicided junctions as will be described below. Layer 113 is employed to mask portions of the structure during the siliciding process described below.

Figure 3:
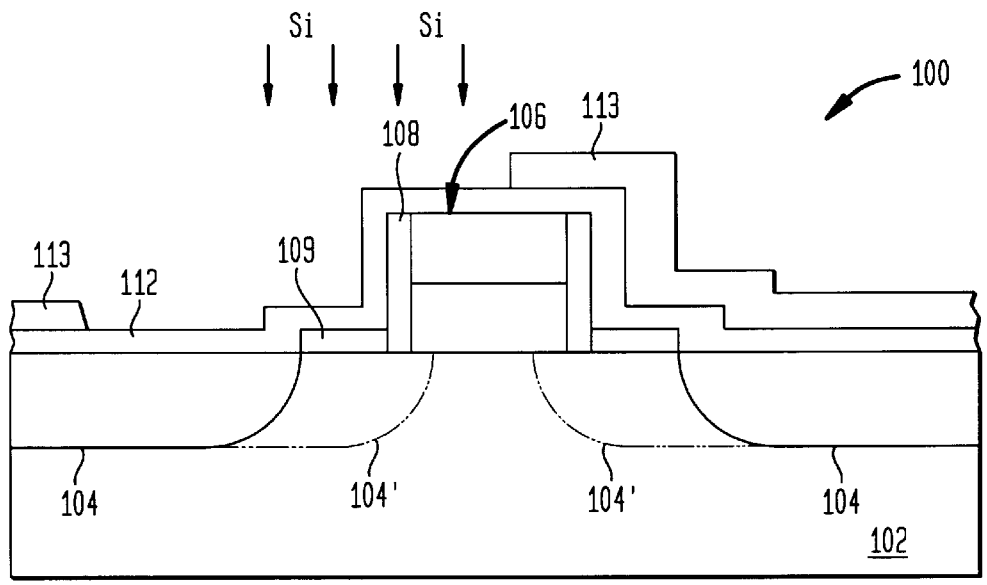
FIG. 3 is a cross-sectional view of the semiconductor device of FIG. 2 showing silicon exposure of a direct buried strap portion of a conductive layer in accordance with the present invention.

Referring to FIG. 3, resist layer 116 is stripped away. A silylation process is performed which deposits silicon on exposed portions of conductive layer 112 (portions of conductive layer 112 not covered by sacrificial dielectric layer 113). A "cold" process or a "hot" process may be employed to perform the deposition of Si. In the cold process, Si is deposited at a temperature of between about 20° C. and about 400° C. followed by a rapid thermal anneal (RTA). The RTA drives Si into conductive layer 112, and the metal of conductive layer 112 is driven into substrate 102 to form junctions 114 (114a and 114b). In the hot process, Si is deposited at a temperature of between about 400° C. and about 700° C. and not followed by a rapid thermal anneal (RTA). The RTA or hot deposition of Si drives Si into conductive layer 112, and the metal of conductive layer 112 is driven into substrate 102 to form junctions 114 and a direct buried strap 120. Excess silicon buildup is stripped from all surfaces by employing a wet etch process, for example.

Figure 4:
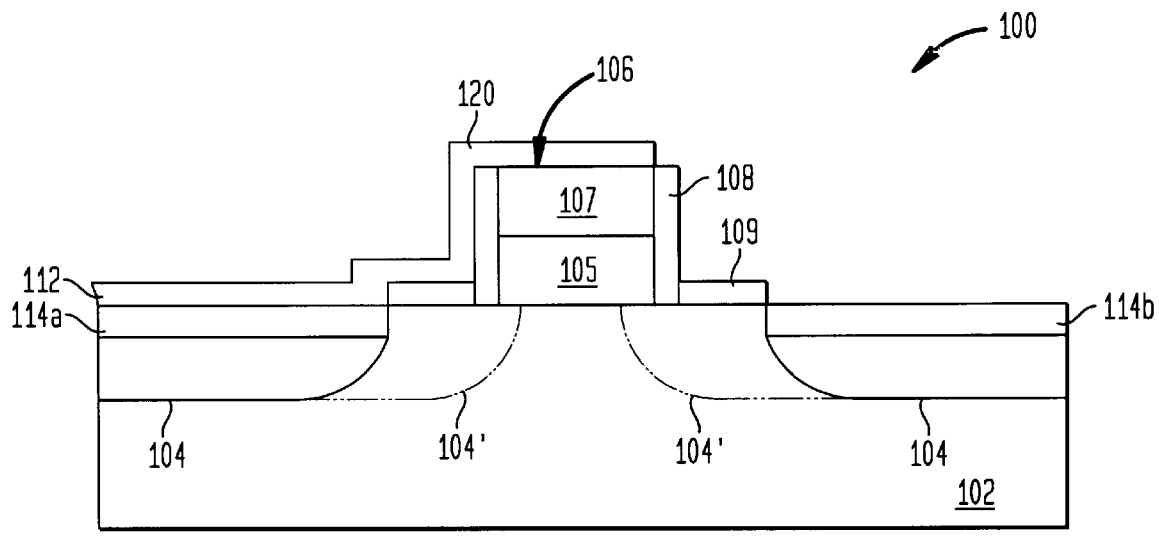
FIG. 4 is a cross-sectional view of the semiconductor device of FIG. 3 showing the direct buried strap and diffusion regions formed in accordance with the present invention.

Direct buried strap 120 and junctions 114 are now silicided as shown in FIG. 4. In a preferred embodiment, direct buried strap 120 and junctions 114 include Cobalt silicide (e.g., $CoSi_2$), Titanium silicide, Tungsten silicide, or other suicides.

Referring to FIG. 4, sacrificial dielectric layer 113 (FIG. 2) is removed exposing a remaining portion of conductive layer 112 (FIG. 2). The remaining portion of conductive layer 112 which was protected from silylation by sacrificial dielectric layer 113 is removed selective to direct buried strap 120, junctions 114 and protective dielectric layer 108. This advantageously leaves direct buried strap 120 as a same level interconnect between gate stack 106 and junction 114a (and diffusion region 104 corresponding to junction 114a). A rapid thermal anneal (RTA) may be now be performed to form a more stable and uniform silicide in direct buried strap 120 and junctions 114.

Figure 5:
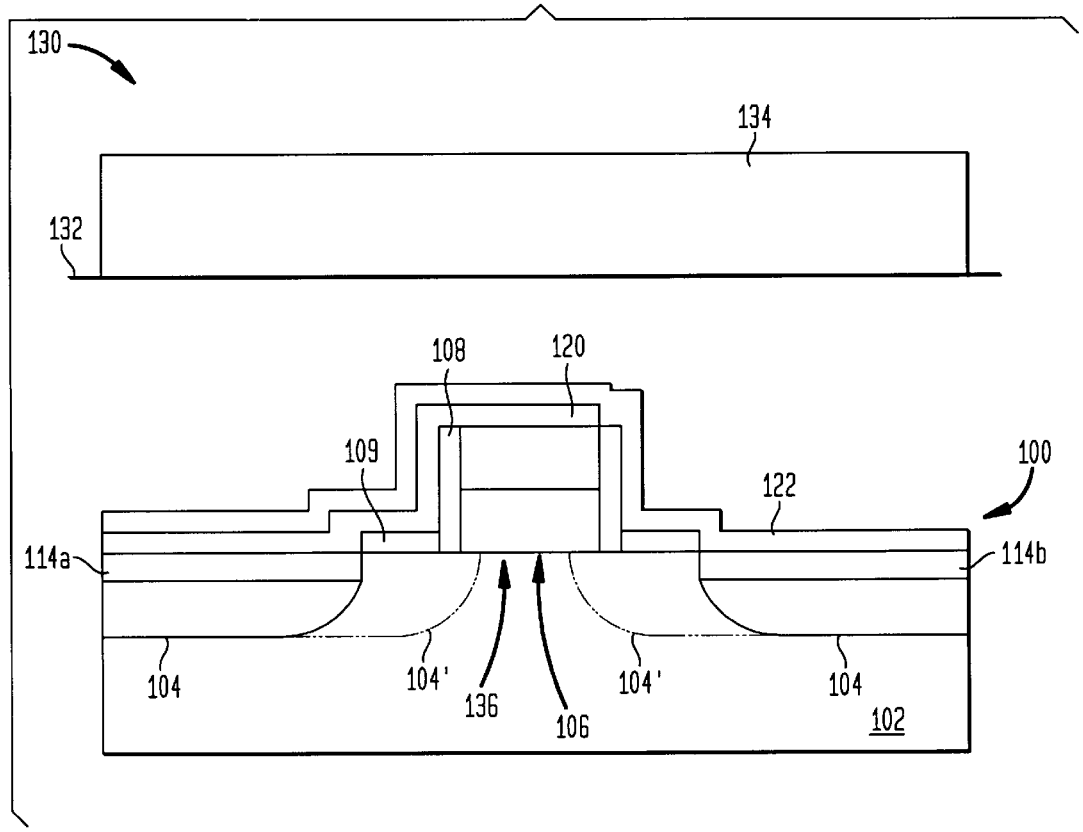
FIG. 5 is a cross-sectional view of the semiconductor device of FIG. 4 showing an etch stop layer, an interlevel dielectric layer and a metal layer formed in accordance with the present invention.

Referring to FIG. 5, an etch stop layer 122 deposition may be performed over junctions 114 and gate stack 106. Etch stop layer 122 is preferably formed from a nitride, such as silicon nitride. Etch stop layer 122 may be included to protect the silicided structures, e.g., junctions 114 and direct buried strap 120 during processing steps which follow, for example, contact formation.

A dielectric layer 130 is deposited over gate stack 106 and junctions 114. Dielectric layer 130 is employed as a contact dielectric through which contacts may be formed. Dielectric layer 130, may include an oxide, such as silicon oxide, or a glass, such as boro-phosphorous silicate glass (BPSG) or equivalents. After deposition of layer 130, a planarization process is preferably performed on a top surface 132 of layer 130. In one embodiment, a chemical-mechanical polishing (CMP) process is employed to planarize surface 132. Surface 132 is employed to support upper structures for the semiconductor device. Metal lines 134 are formed in upper layers of the structure. In accordance with the present invention, metal lines 134 may be routed directly over gate stack 106 and junctions 114 since direct buried strap 120 is formed. Instead of a contact going from gate stack 106 to metal line 134 and another contact going from metal line 134 to junction 114a, direct buried strap 120 provides a same level interconnection for cross-coupling a transistor 136 formed by junctions 114 (and diffusion regions 104) and gate stack 106. Processing may continue as is known in the art.

By providing direct buried strap 120, an area gain is achieved. By eliminating the need for additional contacts and by providing metal line routing directly over transistor 136, an area savings of between about 10% and about 30% is achieved. This permits higher memory cell or component density for semiconductor devices, or permits memory cells, capacitors or other components to be larger in size while maintaining cell density. The area density of random logic is capable of being increased due to the implementation of the present invention. Further, misalignment issues for conventional contacts are advantageously avoided since direct buried strap 120 is automatically aligned during the formation process. The conventional contacts are inherently subject to misalignment issues because the contacts have to hit both the gate and the diffusion regions.

The present invention may be employed as a process option, which may be incorporated into a process sequence without affecting a base process. Direct buried straps 120 being implemented as a process option is advantageous over the conventional local interconnect approach, which is not compatible with foundry technologies. In the conventional process, a special separate process library is necessary for implementation. This inhibits the use of products in industry standard designs.

The present invention includes process steps which are performed on sacrificial dielectric layer 113 which covers conductive layer 112. There is no influence on device parameters, such as width of protective dielectric layer 108 on side walls of gate stack 106, shallow trench isolation (STI) divots or substrate 102 quality in active areas (e.g., junctions 114).

Having described preferred embodiments for a method and apparatus for a direct buried strap for same level contact interconnections for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a direct strap for a semiconductor device comprising the steps of:

forming a gate stack on a semiconductor substrate;

forming a protective layer on sidewalls of the gate stack, the protective layer extending horizontally over a portion of the semiconductor substrate adjacent to the gate stack;

forming a conductive layer over the protective layer and in contact with a gate conductor of the gate stack and in contact with a diffusion region formed in the semiconductor substrate adjacent to the gate conductor;

forming a sacrificial layer over the conductive layer;

patterning the sacrificial layer to expose a portion of the conductive layer, the portion of the conductive layer which is exposed includes a portion of the conductive layer over the gate conductor and a portion of the substrate adjacent to the gate conductor; and siliciding the exposed areas of the conductive layer to form a direct buried strap and a silicided diffusion region, the direct buried strap electrically connecting the gate conductor to the diffusion region in a same level of the semiconductor device.

2. The method as recited in claim 1, wherein the step of siliciding includes the step of depositing silicon on the conductive layer.

3. The method as recited in claim 2, wherein the step of depositing silicon on the conductive layer includes a cold deposition of silicon in a temperature range of between about 20° C. and about 400° C.

4. The method as recited in claim 3, wherein the step of siliciding includes the step of performing a rapid thermal anneal (RTA).

5. The method as recited in claim 2, wherein the step of depositing silicon on the conductive layer includes a hot deposition of silicon in a temperature range of between about 400° C. and about 700° C.

6. The method as recited in claim 1, wherein the step of patterning the sacrificial layer to expose a portion of the conductive layer includes the step of protecting a second portion of the conductive layer from siliciding by employing the sacrificial layer as a mask and further comprising the steps of:

stripping the sacrificial layer after siliciding; and stripping the second portion of the conductive layer.

7. The method as recited in claim 6, further comprising the step of annealing the semiconductor device by employing a rapid thermal anneal.

8. The method as recited in claim 6, wherein the substrate includes silicon and the second portion of the conduction layer includes a third portion which contacts a portion of the substrate and further comprising the step of annealing the third portion of the conductive layer and the portion of the substrate in contact with the third portion to form a silicided junction.

9. The method as recited in claim 1, further comprising the steps of:

forming a second dielectric layer over the gate conductor and the silicided diffusion region; and forming metal layers over the second dielectric layer wherein the gate conductor is connected to the silicided diffusion region while avoiding interconnection to other metal layers.

10. The method as recited in claim 1, wherein the conductive layer includes one of Tungsten, Cobalt and Titanium.

11. A method for forming a direct buried strap for a semiconductor device comprising the steps of:

providing a silicon substrate;

forming a gate stack on the substrate, the gate stack including a protective dielectric layer on vertical surfaces, the protective dielectric layer including a horizontal portion extending outward from the gate stack in contact with the substrate;

forming a conductive layer capable of being silicided in contact with a gate conductor of the gate stack and the substrate adjacent to the gate stack beyond the horizontal portion of the protective dielectric layer;

forming a sacrificial layer over the conductive layer;

patterning the sacrificial layer to expose a portion of the conductive layer, the portion of the conductive layer which is exposed includes a portion of the conductive layer over the gate stack in contact with the gate conductor and a portion of the substrate adjacent to the gate stack beyond the horizontal portion of the protective dielectric layer; and siliciding the exposed areas of the conductive layer to form a direct buried strap along the gate stack over the protective dielectric layer and a silicided diffusion region on the substrate adjacent to the gate stack beyond the horizontal portion of the protective dielectric layer, the direct buried strap electrically connecting the gate conductor to the silicided diffusion region in a same level of the semiconductor device.

12. The method as recited in claim 11, wherein the step of siliciding includes the step of depositing silicon on the conductive layer.

13. The method as recited in claim 12, wherein the step of depositing silicon on the conductive layer includes a cold deposition of silicon in a temperature range of between about 20° C. and about 400° C.

14. The method as recited in claim 13, wherein the step of siliciding includes the step of performing a rapid thermal anneal (RTA).

15. The method as recited in claim 12, wherein the step of depositing silicon on the conductive layer includes a hot deposition of silicon in a temperature range of between about 400° C. and about 700° C.

16. The method as recited in claim 11, wherein the step of patterning the sacrificial layer to expose a portion of the conductive layer includes the step of protecting a second portion of the conductive layer from siliciding by employing the sacrificial layer as a mask and further comprising the steps of:

stripping the sacrificial layer after siliciding; and stripping the second portion of the conductive layer.

17. The method as recited in claim 16, further comprising the step of annealing the semiconductor device by employing a rapid thermal anneal.

18. The method as recited in claim 16, wherein the second portion of the conduction layer includes a third portion which contacts a portion of the substrate and further comprising the step of annealing the third portion of the conductive layer and the portion of the substrate in contact with the third portion to form a silicided junction.

19. The method as recited in claim 11, further comprising the steps of:

forming an interlevel dielectric layer over the gate stack and the silicided diffusion region; and forming metal layers over the interlevel dielectric layer wherein the gate conductor is connected to the silicided diffusion region while avoiding interconnection to other metal layers.

20. The method as recited in claim 11, wherein the conductive layer includes one of Tungsten, Cobalt and Titanium.

* * * * *